United States Patent [19]

Zimmermann et al.

[11] Patent Number: 5,416,277
[45] Date of Patent: May 16, 1995

[54] CICUIT AND PROCESS OF MANUFACTURING THE CIRCUIT

[75] Inventors: Herbert Zimmermann, Freiberg/Heutingsheim; Klaus Steinle, Sindelfingen; Kurt Spitzenberger, Merklingen; Guenther Stecher, Leonberg, all of Germany

[73] Assignee: Robert Bosch GmbH, Stuttgart, Germany

[21] Appl. No.: 33,326

[22] PCT Filed: Sep. 6, 1991

[86] PCT No.: PCT/DE91/00709

§ 371 Date: Mar. 18, 1993

§ 102(e) Date: Mar. 18, 1993

[87] PCT Pub. No.: WO92/05677

PCT Pub. Date: Apr. 2, 1992

[30] Foreign Application Priority Data

Sep. 22, 1990 [DE] Germany ............ 40 30 055.2

[51] Int. Cl.⁶ .................................................. B22F 7/02
[52] U.S. Cl. ........................................ 174/257; 156/89; 419/10
[58] Field of Search ............... 156/89, 291, 295, 325; 361/397, 400, 401, 403, 765, 748; 428/901; 174/250, 256, 257

[56] References Cited

U.S. PATENT DOCUMENTS

| | | | |
|---|---|---|---|
| 4,130,722 | 12/1978 | Levijoki | 174/68.5 |
| 4,645,552 | 2/1987 | Vitriol et al. | 156/89 |
| 4,652,977 | 3/1987 | Jones | 361/414 |
| 4,799,984 | 1/1989 | Rellick | 156/89 |
| 5,087,509 | 2/1992 | Kuromitsu et al. | 428/195 |
| 5,176,772 | 1/1993 | Ohtaki | 156/89 |
| 5,176,773 | 1/1993 | Thompson et al. | 156/89 |

FOREIGN PATENT DOCUMENTS

| | | |
|---|---|---|
| 2736055 | 2/1978 | Germany . |
| 61-36962A | 2/1986 | Japan . |
| 61-42159A | 2/1986 | Japan . |

*Primary Examiner*—Christopher A. Fiorilla
*Attorney, Agent, or Firm*—Spencer, Frank & Schneider

[57] ABSTRACT

In a process for manufacturing a circuit including a first circuit plane of a ceramic substrate which is covered with, for example, thick-film structures and is imprinted with corresponding conductor paths having contact faces, the ceramic substrate is to be connected with a second circuit plane composed of a green tape substrate.

21 Claims, 2 Drawing Sheets

CICUIT AND PROCESS OF MANUFACTURING THE CIRCUIT

BACKGROUND OF THE INVENTION

The invention relates to a process of manufacturing a circuit including a first circuit plane composed of a ceramic substrate which is covered with, for example, thick-film structures and imprinted with corresponding conductor paths having contact faces.

Increasing requirements for the complexity of future hybrid circuits and the demand for short circuit path lengths can be realized only with multi-layer circuits. New processes have been developed due to process specific drawbacks, particularly due to geometrical limitations as a result of uneven topography and curvatures of the substrate and due to decreasing yields as a result of the high number of process steps in multi-layer thick-film circuits equipped with printed-on dielectric materials. These processes include the so-called green tape process. In this green tape or green sheet process, unsintered ceramic sheets are imprinted with switching elements and conductor paths, generally assembled into a multi-layer element, pressed and sintered. The development of these low-temperature sintering (at approximately 850° C.) glass ceramic sheets permits the realization of highly complex multi-layer circuits with high yields.

On the other hand, the thermal conductivity of these multi-layer circuits lies at only about 15% of a ceramic element composed, for example, of $Al_2O_3$. Likewise, its mechanical strength lies below that of an $Al_2O_3$ ceramic, namely even below half the strength. Therefore, these green tape circuits are not well suited for robust use in the electronic systems of automobiles.

SUMMARY OF THE INVENTION

According to an embodiment of the present invention, a ceramic substrate is to be connected with a second circuit plane made of a green tape substrate. For example, the green tape substrate may constitute the signal portion of a multi-layer circuit in a thick-film hybrid circuit. For this purpose, however, it is necessary to have a reliable electrical and mechanical connection between the two substrates. This connection is the object of the process sequence described below.

The multi-layer circuit will generally cover only part of the circuit area of the ceramic substrate. The multi-layer circuit, that is, the green tape substrate, could also be provided with recesses into which the power components are inserted which are then electrically connected with the circuit, for example, by means of bonding wires.

The circuit according to the invention avoids the drawbacks of the green tape substrate, since the strength and thermal conductivity of the entire circuit is determined by the ceramic substrate.

According to the invention, vias are formed in the green tape substrate before the ceramic substrate and the green tape substrate are connected and these vias are filled with silver or a similar conductive contact material. The surfaces of this contact material then form counter-contact faces on the green tape substrate corresponding to the contact faces on the ceramic substrate. Vias are stamped and drilled holes in the green tape substrate. A typical via has a diameter of about 0.2 mm.

Before the two substrates are connected, the contact faces on the ceramic substrate are imprinted with a bonding layer. A silver paste that is low in glass or free of glass is available as a bonding layer. If copper is selected as the bonding layer a particularly reliable bond can be produced between the silver contact face on the ceramic substrate and the counter-contact face on the green tape substrate.

The diameter of the contact faces and thus of the connecting layer as well should in any case be larger, for example 1 mm, than the diameter of the counter-contact faces (0.2 mm). Thus there exists a certain tolerance for the placement of the green tape substrate onto the ceramic substrate in order to align the counter-contact face to the corresponding contact face.

Another significant aspect of the present invention is that, likewise before the connection of ceramic substrate and green tape substrate, either the ceramic substrate or the green tape substrate or both are imprinted with webs of a glass on the faces to be connected. In this connection, cross-shaped glass webs have been found to be favorable. The glass is a glass that melts at about 500° C. The typical dimensions of the webs are 5 mm in length and 0.5 mm in width.

The dried thickness of the preferably cross-shaped glass webs may here be noticeably greater than the sum of the thicknesses of the contact face and the bonding layer which is approximately 40 $\mu$m.

The thus prepared substrates are now placed on top of one another so that, if possible, contact faces and counter-contact faces lie opposite one another. Then the entire circuit is fired, which is effected in a continuous furnace at approximately either 850° C. (for a silver paste bonding layer) or 770° C. (for a copper paste bonding layer).

During firing, the contact faces and the counter-contact faces sinter together through the applied bonding layer and thereby form pedestals of a height of approximately 15 $\mu$m. Since silver and copper form a eutectic structure at 780° C., a particularly reliable bond can be realized if the arrangement is fired at about 10° C. below this temperature. The glass of the webs which has a low viscosity at the firing temperature of either about 850° C. (silver paste) or 770° C. (copper paste), respectively, connects both substrates in the developing gap of about 15 $\mu$m in width. This procedure causes the glass to flow apart by about twice the amount so that the distance between the two substrates is reduced and a reliable bond between contact faces and counter-contact faces is ensured.

At the firing temperature of 850° C., the high percentage of glass of about 40 weight percent in the green tape substrate causes the green tape substrate to soften and thus ensures the sintering together of all contact locations even if the ceramic substrate is unpolished. The difference between the firing temperature (approximately 850° C.) and the melting temperature of the glass (approximately 500° C.) employed for the mechanical connection, makes the critical layer thickness relationships between the contact points and the glass webs, which in practice would otherwise be impossible to manage, less critical.

Another advantage of the present invention is that the processes employed substantially correspond to those already employed for the production of large quantities of thick-film circuits. Moreover, the advantages of the thick-film circuits on ceramics are combined with those of the green tape circuits. High mechanical strength and good thermal conductivity remain ensured.

The invention also includes a circuit produced according to the above-mentioned process.

BRIEF DESCRIPTION OF THE DRAWINGS

Further advantages of the invention will be described in greater detail with reference to the drawings, in which.

DETAILED DESCRIPTION OF THE PREFERRED EMBODIMENT

A circuit arrangement R according to the invention includes a ceramic substrate 1 which is covered with conductor paths 2. This ceramic substrate 1 forms a first circuit plane. Above ceramic substrate 1, a second circuit plane is disposed which partially covers the ceramic substrate and is configured as a green tape substrate 3. This green tape substrate 3 is composed of superposed ceramic sheets, with the stacking of several sheets imprinted with conductor paths resulting in a multi-layer circuit. This multi-layer circuit may form, for example, the signal component for the first circuit plane, and this first circuit plane may be a thick-film circuit.

Figure 1:
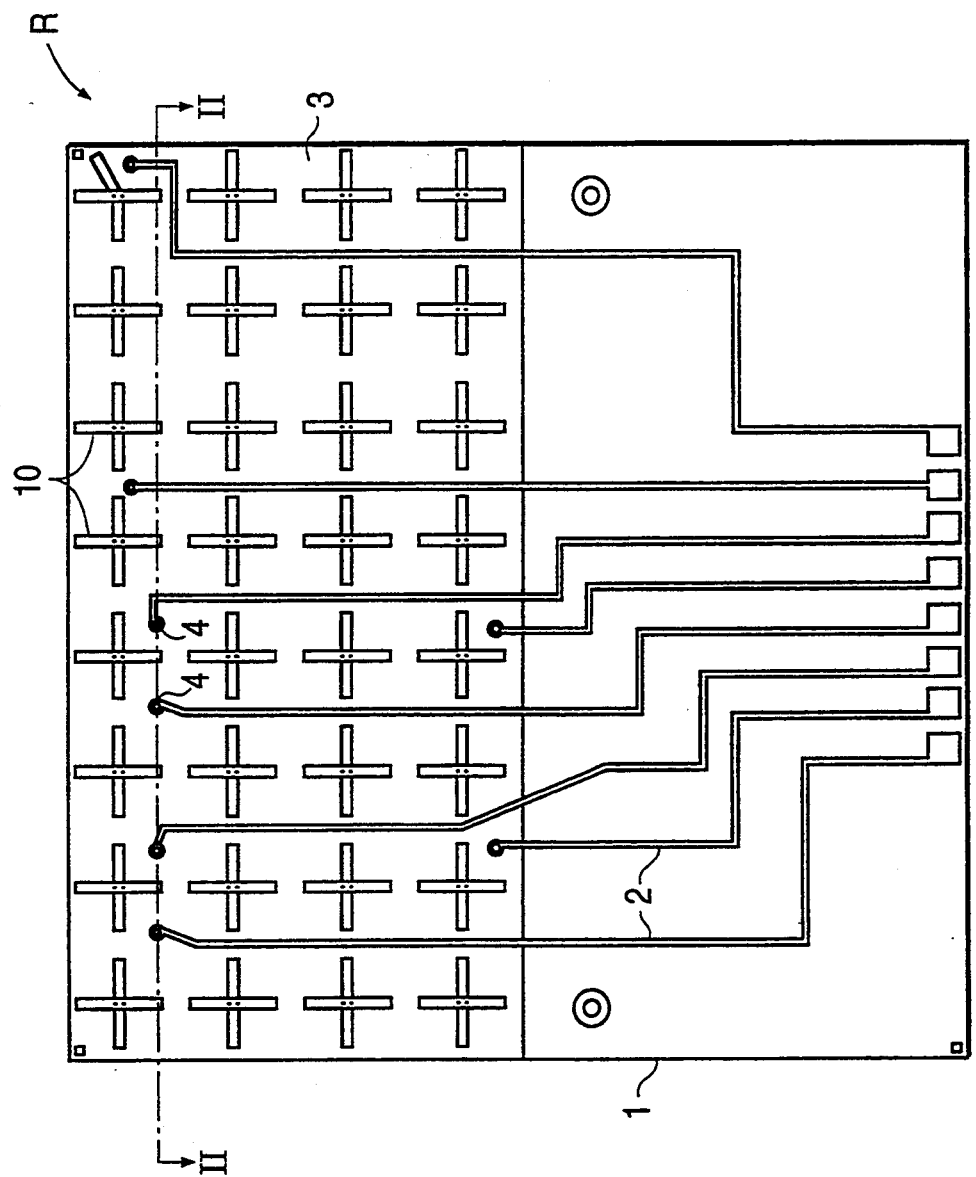
FIG. 1 is a top view of a circuit arrangement according to an embodiment of the invention.
Figure 2:
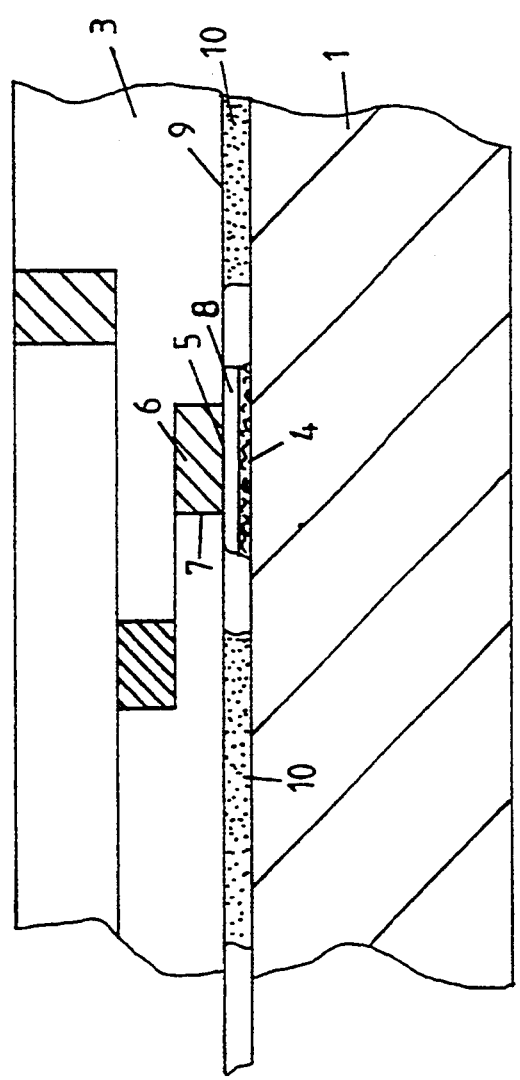
FIG. 2 is a partially enlarged cross-sectional view of the circuit arrangement, seen along line II—II of FIG. 1.

Contact faces 4 are provided at the end of conductor paths 2 on ceramic substrate 1. The diameter of each contact face 4 may be, for example, up to 1 mm. In any case, the diameter of contact face 4 is greater than the diameter of a counter-contact face 5 (see FIG. 2) in the green tape substrate 3 which is composed of a silver filling 6 in a via 7. These vias 7 are holes that are punched or drilled into the green tape substrate 3 forming the second circuit plane, which are then filled with silver 6.

Then, a bonding layer 8 is printed onto contact faces 4, with the former possibly being composed of a silver paste that is low in glass or is free of glass. For the above reasons, a copper paste has also been found to be very favorable.

Now, ceramic substrate 1 or the underside 9 of green tape substrate 3 or both are imprinted with cross-shaped webs 10 of a glass that melts around 500° C. Typical dimensions for these webs are 5 mm in length and 0.5 mm in width. The thickness of webs 10, which have been dried after being printed, may noticeably exceed the sum of the thicknesses of contact face 4 plus bonding layer 8 which is about 40 μm.

After webs 10 and particularly bonding layer 8 have dried, green tape substrate 3 is placed onto ceramic substrate 1 so that the counter-contact face 5 comes to lie above its associated bonding layer 8 and contact face 4.

Now the superposed substrates 1 and 3 are fired, for example in a continuous furnace, either at about 850° C. (for silver paste as the bonding layer) or about 770° C., (for copper paste as the bonding layer). During the firing, contact faces 4 and counter-contact faces 5 sinter together through the applied bonding layer 8 and thus form pedestals of a height of about 15 μm. At a joining temperature of either about 850° C. (silver paste) or about 770° C. (copper paste), webs 10, which are made of a low-viscosity glass, also flow apart and spread out by about twice their area. Thus the required contact is produced between counter-contact face 5 and bonding layer 8 and a bond is produced between the two substrates 1 and 3. Since the diameter of contact faces 4 is substantially larger than the diameter of counter-contact faces 5, displacements that sometimes occur when green tape substrate 3 is placed onto ceramic substrate 1 can be compensated.

We claim:

1. A process for manufacturing a circuit including a first circuit plane composed of a ceramic substrate provided with thick-film structures and imprinted with corresponding conductor paths having contact faces, said first circuit plane connected with a second circuit plane composed of a green tape substrate provided with respective counter-contact faces, comprising steps of:

imprinting at least one of the ceramic substrate and an underside of the green tape substrate with glass webs;

placing said ceramic substrate adjacent said green tape substrate so that the glass webs are disposed between and touch both of the substrates; and firing said ceramic substrate and said green tape substrate at a temperature which corresponds to a temperature at which the contact faces and counter-contact faces will join together and which is higher than a melting temperature of the glass webs.

2. A process according to claim 1, further comprising steps of shaping vias into the green tape substrate and filling the vias with a conductive contact material to form said counter-contact faces corresponding to the contact faces on the ceramic substrate.

3. A process according to claim 2, wherein the contact faces on the ceramic substrate have a larger diameter than a diameter of the respective counter-contact faces on the green tape substrate.

4. A process according to claim 2, further comprising a step of imprinting each contact face with a respective bonding layer.

5. A process according to claim 4, wherein the bonding layer is a silver paste that is one of low in glass and free of glass.

6. A process according to claim 5, wherein the firing temperature is about 850° C.

7. A process according to claim 5 wherein the contact face material is silver.

8. A process according to claim 4, wherein the bonding layer is a copper paste.

9. A process according to claim 8, wherein the firing temperature is about 770° C.

10. A process according to claim 8 wherein the contact face material is silver.

11. A process according to claim 4, wherein the step of placing the ceramic substrate adjacent the green tape substrate includes arranging the substrates such that the contact faces and respective bonding layers are disposed on the respective counter-contact faces prior to firing the ceramic substrate and the green tape substrate.

12. A process according to claim 2 wherein the contact face material is silver.

13. A circuit comprising:

a first circuit plane including a ceramic substrate provided with thick-film hybrids and imprinted with corresponding conductor paths having contact faces; and a second circuit plane composed of a second substrate formed of a green tape substrate which has been fired, the second substrate being disposed above the ceramic substrate and being bonded to the ceramic substrate by glass webs which were imprinted on at least one of the ceramic substrate and the green tape substrate and melted during firing of the substrates.

14. A circuit according to claim 13, further comprising a respective bonding layer for each of the contact faces and respective counter-contact faces in the second substrate bonded to the respective contact faces via the respective bonding layers.

15. A circuit according to claim 14, wherein the bonding layers are silver paste that is one of low in glass and free of glass.

16. A circuit according to claim 14, wherein the counter-contact faces are silver filled into vias in the second substrate.

17. A circuit according to claim 14, wherein a diameter of the counter-contact faces is smaller than a diameter of the contact faces.

18. A circuit according to claim 14, wherein each counter-contact face is bonded to the respective contact face via the respective bonding layer by sintering.

19. A circuit according to claim 14, wherein the bonding layers are a copper paste.

20. A circuit according to claim 19, wherein each counter-contact face is bonded to the respective contact face via the respective bonding layer through formation of a eutectic copper-silver bond.

21. A circuit according to claim 13, wherein the glass webs are composed of a glass which melts at about 500° C.

* * * * *